United States Patent [19]

Lo

[11] Patent Number: 5,294,808
[45] Date of Patent: Mar. 15, 1994

[54] PSEUDOMORPHIC AND DISLOCATION FREE HETEROEPITAXIAL STRUCTURES

[75] Inventor: Yu-Hwa Lo, Ithaca, N.Y.

[73] Assignee: Cornell Research Foundation, Inc., Ithaca, N.Y.

[21] Appl. No.: 964,638

[22] Filed: Oct. 23, 1992

[51] Int. Cl.$^5$ ............................................. H01L 27/12
[52] U.S. Cl. ......................................... 257/17; 257/18; 257/21; 257/190; 257/201
[58] Field of Search ............................ 257/18, 21, 14, 17, 257/20, 22, 19, 201, 190

[56] References Cited

U.S. PATENT DOCUMENTS

| | | | |
|---|---|---|---|
| 3,428,499 | 2/1969 | Cullis | 148/174 |
| 3,958,263 | 5/1976 | Panish et al. | 357/18 |
| 4,088,515 | 5/1978 | Blakeslee et al. | 148/175 |
| 4,558,336 | 12/1985 | Chang et al. | 257/18 |
| 4,841,531 | 6/1989 | Kondow et al. | 372/43 |
| 4,876,210 | 10/1989 | Barnett et al. | 437/5 |
| 4,893,313 | 1/1990 | Hatakoshi et al. | 372/46 |
| 4,984,242 | 1/1991 | Scifres et al. | 372/45 |
| 5,008,718 | 4/1991 | Fletcher et al. | 357/17 |

FOREIGN PATENT DOCUMENTS 1-223718  9/1989  Japan.

OTHER PUBLICATIONS

Hull et al., "Stability of Semiconductor Strained-Layer Superlattices," *Appl. Phys. Lett.* 48(1), 6 Jan. 1986, pp. 56–58.

Miles et al., "Dependence of Critical Thickness on Growth Temperature in $Ge_xSi_{1-x}$/Si Superlattices," *Appl. Phys. Lett.* 52 (11), 14 Mar. 1988, pp. 916–918.

Reithmaier et al, "Investigation of the Critical Layer Thickness in Elastically Strained in GaAs/GaAlAs Quantum Wells by Photoluminescence and Transmission Electron Microscopy," *Appl. Phys. Lett.* 54(1), 2 Jan. 1988, pp. 48–50.

*Primary Examiner*—William Mintel
*Attorney, Agent, or Firm*—Jones, Tullar & Cooper

[57] ABSTRACT

Pseudomorphic and dislocation free heteroepitaxial structures are formed in which pseudomorphic and heteroepitaxial layers of any desired thickness are grown on thin, free-standing substrates. In the case of pseudomorphic structures, the substrates are chosen to have a thickness less than the critical thickness above which misfit dislocations will form between the pseudomorphic layers and the substrate. Use of thin substrates in this manner prevents the overall strain energy between the two layers from ever becoming large enough to generate misfit dislocations, regardless of the pseudomorphic layer thickness. This concept can also be employed in the formation of defect free heteroepitaxial layers. If a heteroepitaxial layer is grown on a very thin substrate, an effect known as dislocation gettering will cause any dislocations between the two layers to propagate into the substrate, thus leaving the heteroepitaxial layer defect free. Multiple layer superlattice structures can also be formed which either have a very large lattice mismatch between the top and bottom layers, or strain compensation between the layers and the bottom substrate.

5 Claims, 4 Drawing Sheets

PSEUDOMORPHIC AND DISLOCATION FREE HETEROEPITAXIAL STRUCTURES

BACKGROUND OF THE INVENTION

1. Field of the Invention

The present invention is directed generally toward pseudomorphic and dislocation free heteroepitaxial structures, and methods of forming the same. In particular, the subject invention relates to such structures in which pseudomorphic and heteroepitaxial layers are grown on thin, free-standing substrates.

2. Description of the Prior Art

In the semiconductor industries, many devices, such as lasers and transistors, of very high performance and of peculiar characteristics are made of a class of materials called heteroepitaxial or pseudomorphic structures. A heteroepitaxial structure is one in which a semiconductor is epitaxially grown on a substrate of different lattice constant. If the heteroepitaxial layer is thinner than a certain dimension, the so called "critical thickness," the elastic energy in the system is not large enough to create misfit dislocations, and a pseudomorphic structure is produced. Such dislocations, if produced, would detrimentally effect device performance.

Since the introduction of pseudomorphic epitaxy, this structure has been widely applied to high performance electronic and optoelectronic devices. Because of the extra degree of freedom offered by the pseudomorphic structure, researchers can do ingenious bandgap engineering to not only improve existing device performance but also to create new devices. For all the high quality pseudomorphic structures so far reported, the pseudomorphic layer thickness is thinner than the critical thickness, thus preventing the formation of misfit dislocations. For example, in devices such as quantum well lasers, the strained active layers are made thinner than the critical thickness. However, for many other applications, such as detectors and modulators, pseudomorphic layers much thicker than the critical thickness are desirable.

Another critical problem for many semiconductor heteroepitaxial devices is the density of threading dislocations. The existence of threading dislocations is detrimental for many devices, such as lasers and photodetectors. In conventional growth conditions, once the misfit dislocations are developed, they are driven towards the layer surface by an image force, resulting in an undesirable situation.

It is clear from the foregoing that there exists a need for pseudomorphic and heteroepitaxial structures which can be grown or formed of any arbitrary thickness without the formation of misfit or threading dislocations, regardless of the critical thickness of the structure.

SUMMARY OF THE INVENTION

It is therefore the object of the present invention to provide pseudomorphic and dislocation free heteroepitaxial structures of any arbitrary thickness, regardless of the critical thickness of the structures.

This, and other, objects of the invention are achieved through provision of pseudomorphic and heteroepitaxial structures in which heteroepitaxial layers are grown on thin, free standing substrates, thus lifting the constraint of critical thickness. Applicant has discovered that by using a thin diaphragm structure having a thickness smaller than the critical thickness as a substrate, the overall strain energy generated between the substrate and a heteroepitaxial layer formed on the substrate, will never be large enough to generate misfit dislocations between the two, regardless of the thickness of the epitaxial layer.

Use of a very thin substrate layer also results in an effect known as dislocation gettering that improves the quality of the heteroepitaxy. This effect, only existent for epitaxial growth on thin substrates, causes any interface dislocations that do form to be pushed away from the epitaxial layers, rather than propagating towards them. Thus, contrary to the case of conventional epitaxial growth on thick substrates, even if the dislocations develop at the interface, they do not propagate into the epitaxy. Therefore, defect free heteroepitaxy can be obtained.

In this manner, a thin substrate can also be employed to form a layer of defect free heteroepitaxy. In particular, if a layer of heteroepitaxy is formed on a thin substrate, the dislocation gettering effect will cause any interface dislocations to propagate into the thin substrate, thus insuring that the layer of heteroepitaxy is defect free. The thin substrate can then be removed by any known conventional technique, thus leaving the layer of defect free heteroepitaxy.

The thin substrate concept can also be used to create either indefinitely thick pseudomorphic and heteroepitaxial structures having an extraordinarily large lattice mismatch with the main substrate, or strain compensated quantum well and superlattice structures. In the first case, a first thin layer is formed on a thick substrate, and then a portion of the thick substrate is etched away to form a bridge structure with the thin layer. A second thin pseudomorphic layer having a small lattice mismatch relative to the first thin layer is then deposited on the first thin layer and the first thin substrate is etched thereby now leaving the second thin pseudomorphic layer as a bridge structure. This process continues with successive deposition of additional layers having small lattice mismatches relative to the previous layer until a final thick pseudomorphic layer is deposited having a large lattice mismatch relative to the main substrate. Strain compensation in multiple layer superlattice structures can be accomplished in a similar manner by using a series of alternating layers with compression and tension relative to the substrate so that the net strain over the entire structure is close to zero.

BRIEF DESCRIPTION OF THE DRAWINGS

The foregoing, and additional objects, features and advantages of the present invention will become apparent to those of skill in the art from the following detailed description of a preferred embodiments thereof, taken in conjunction with the accompanying drawings, in which.

DETAILED DESCRIPTION OF THE PREFERRED EMBODIMENTS

Turning now to a more detailed consideration of preferred embodiments of the present invention, the theory by which the invention works will first be discussed. For conventional pseudomorphic structures, material strain is predominantly in the epitaxial thin film because the substrate is too thick to be compliant. For thin substrates, the elastic energy is more evenly distributed between the epilayer and the substrate so that the total energy is reduced. In the extreme case, if a free standing substrate (e.g. a diaphragm structure) thinner than the critical thickness is used, the overall strain energy will never be large enough to generate misfit dislocations regardless of epitaxial layer thickness. The easiest way to understand the argument is to consider the epitaxial layer as a "substrate" and the thin substrate as an "epitaxial layer" in the conventional sense. Since the "epitaxial layer" is thinner than the critical thickness, no misfit dislocation will occur regardless of "substrate" thickness.

Figure 1:
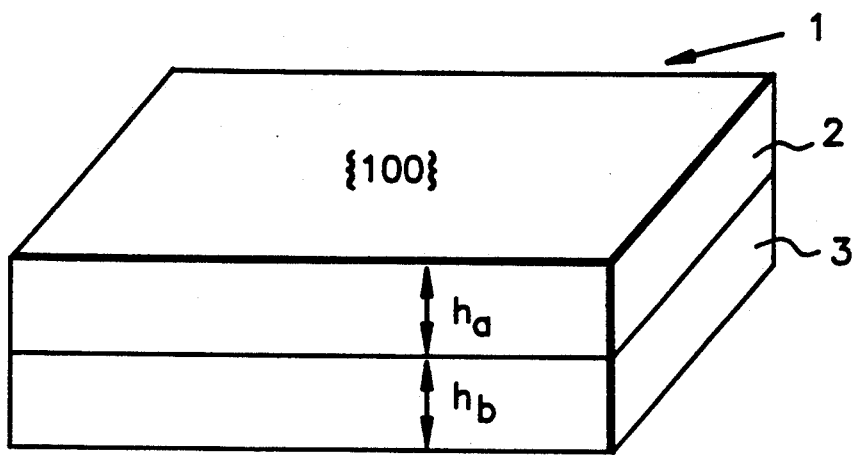
FIG. 1 depicts two mismatched semiconductors.

To establish the quantitative relationship between the substrate thickness and the maximum allowable pseudomorphic layer thickness, consider a structure 1 made of two mismatched 55 100 } semiconductors 2 and 3 as depicted in FIG. 1. Lattice mismatch for the coherent {100} interface gives rise to equal biaxial stresses ($\sigma_{11} = \sigma_{12} = \sigma$) and strains ($\epsilon_{11} = \epsilon_{22} = \epsilon$) in both materials. The condition of mechanical equilibrium dictates that the net force on the material system must be zero, whereupon, $$\sigma_a h_a - \sigma_b h_b = 0 \quad (1)$$

The misfit strains must also partition such that $$\epsilon_o = \epsilon_a + \epsilon_b = \frac{\Delta a}{<a>} \quad (2)$$

where h is the layer thickness and $$\frac{\Delta a}{<a>}$$

is the lattice mismatch between A and B. Neglecting the bending stresses, the strain energy in the system can be represented as $$E = K_a(h_a \epsilon_z^2) + K_b(h_b \epsilon_b^2) \quad (3)$$

where $K_a$ and $K_b$ refer to the relevant elastic constants for the two materials. For simplicity, all elastic constants for both materials are assumed to be identical, so the subscripts in K's can be neglected and represented as K. This is often a good approximation for most pseudomorphic structures such as InGaAs/GaAs and SiGe/Si. Combining Equations (1) and (3) and using $\sigma = c\epsilon$ to relate the stresses and strains, the elastic energy can be written as $$E = K\epsilon_o^2 \left[ \frac{h_a h_b}{h_a + h_b} \right] \quad (4)$$

If the strain energy reaches the critical energy $E_c$, misfit dislocations can be generated. For conventional structures where the substrate is much thicker than the epitaxial layer, the critical thickness is found as $t_c = E_c/(K\epsilon_o^2)$. Defining $h_a$ as the effective critical thickness $t_{eff}$ when E in Equation (4) is equal to $E_c$, we can obtain the dependence of $t_{eff}$ on the substrate thickness $h_b$.

$$\frac{1}{t_{eff}} = \frac{1}{t_c} - \frac{1}{h_b} \quad (5)$$

If the substrate is thinner than the critical thickness (i.e. $h_b < t_c$), then the effective critical thickness can not be found from Equation 5. This means that the strain energy in Equation 4 is never able to reach the critical strain energy $E_c$. Therefore, infinitely thick pseudomorphic structures can be grown without misfit dislocations, which is the same conclusion drawn from the previous argument Even if the substrate is slightly thicker than $t_c$, a pseudomorphic layer thicker than $t_c$ can still be obtained. The effective critical thickness as a function of the substrate thickness is plotted in FIG. 2.

Besides misfit dislocations, another critical problem for many heteroepitaxial devices is the density of threading dislocations which propagate from the interface into the epitaxial layer. For thick substrates, misfit dislocations at the interface always experience a pulling force attracting them towards the film surface. Consequently, misfit dislocations have a tendency to move to the surface as threading dislocations by climbing or slipping. This is the effect of the image force, similar to the image force experienced by a charged particle close to a metal boundary. However, if thin substrates are used, the image force tends to pull the interface dislocations away from the film and into the substrate. This effect can be considered as dislocation gettering, similar to the point defect gettering where defects are diffused away from surface layers. The dislocation gettering effect of thin substrates has great promise in improving the quality of heteroepitaxy. The detailed analysis about the image force experienced by misfit dislocations will be discussed next.

For most semiconductor interfaces, two types of misfit dislocations exist, edge dislocations and 60° dislocations. The former are strictly confined at the interface, but the latter are much more likely to form threading dislocations. Therefore, only the image force applied to 60° dislocations will be discussed. For (100) oriented substrates, consider a 60° dislocation along [100] direction having its Burgers vector ½[101]. Note that the dislocation line and the Burgers vector have an angle of 60°, which explains the name of such a dislocation. The Burgers vector can be decomposed into three orthogonal vectors, two edge dislocations and one screw dislocation, as $$\vec{b} = \tfrac{1}{2}[101] = \vec{b}_{e1} + \vec{b}_s + \vec{b}_{e2} \qquad (6)$$

where $$\vec{b}_{e1} = \tfrac{1}{4}[110]$$
$$\vec{b}_s = \tfrac{1}{4}[110]$$
$$\vec{b}_{e2} = \tfrac{1}{2}[001]$$

Figure 2:
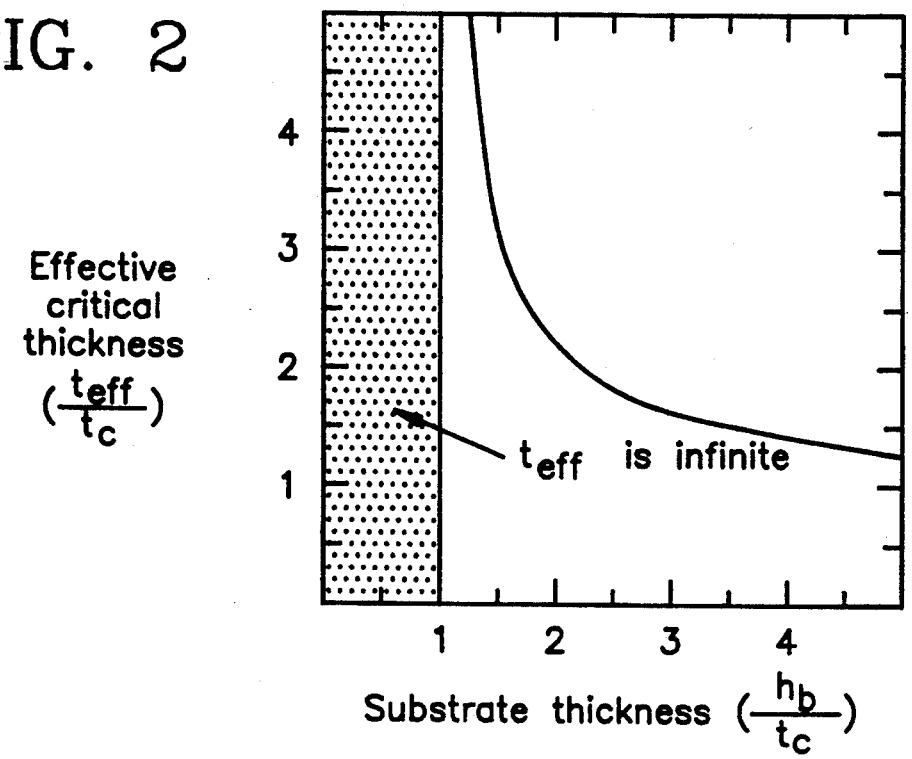
FIG. 2 graphically depicts the dependence of effective critical thickness on the substrate thickness and in which both axes ar normalized to the critical thickness for infinitely thick substrates.
Figure 3:
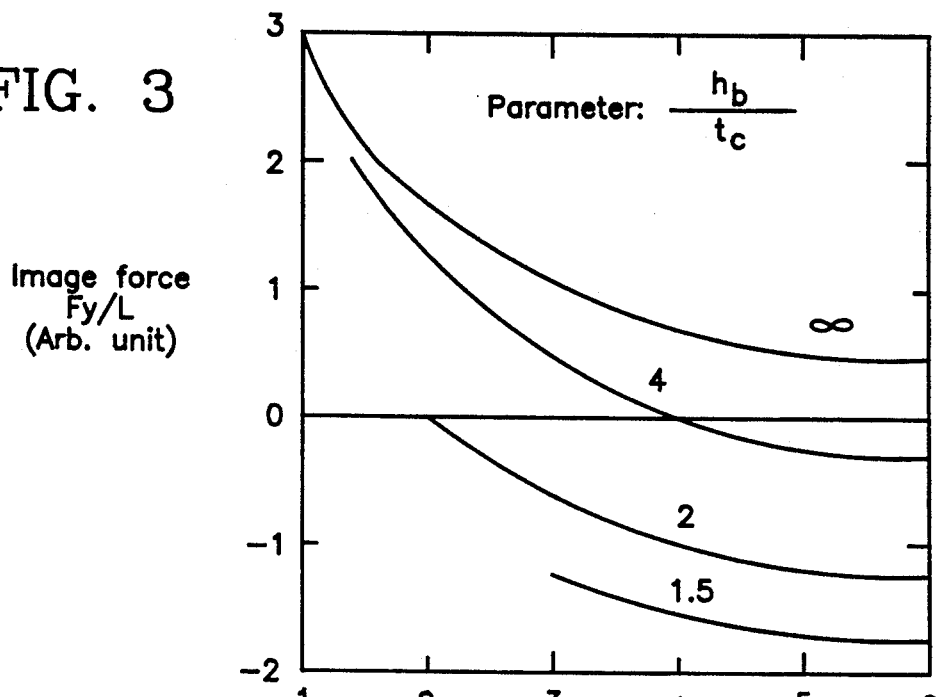
FIG. 3 graphically depicts the dependence of the dislocation image force on the epitaxial layer thickness with substrate thickness as a parameter and in which negative values mean that the interface dislocations are pushed towards the substrate side, known as the dislocation gettering effect.

According to the principle of superposition, the image force applied to a 60° dislocation can be obtained by solving the image force experienced by these three dislocations separately. The net force can be represented as $$\frac{F^{60}}{L} = \frac{D}{(h_a + h_b)} \cot\left(\frac{\pi h_a}{h_a + h_b}\right) \qquad (7)$$

$$D = \left[\frac{1}{4} + \frac{1}{2(1-\nu)}\right]\frac{\mu b^2}{4}$$

where $$\frac{F^{60}}{L}$$

is the force density, defined as the force per unit length, applied to a 60° dislocation in the direction normal to the film surface. The constants $\mu$ and $\nu$ are the shear modulus and the Poisson's ratio of the material. Equation (7) is obtained by considering an infinite series of image dislocations such that the boundary conditions on both the layer surface and the substrate surface are simultaneously satisfied. The summation of this infinite series is just the series representation of the cotangent function as shown in Equation (7). The image force applied to the 60° dislocation as a function of the epilayer thickness is plotted in FIG. 3. Clearly, the strongest attractive force pulling dislocations into the epitaxy occurs in conventional growth conditions where $h_b >> t_c$. The image force becomes negative when the epitaxy layer is thicker than the substrate. The negative force represents the effect of dislocation gettering in which misfit dislocations ar pushed into the substrates. Below the effective critical thickness, no dislocation exists, therefore, each curve in FIG. 3 starts from its corresponding effective critical thickness. Analysis of FIGS. 2 and 3 illustrates that if the substrate is thinner than the critical thickness, pseudomorphic structures of arbitrary thickness can be formed. If the substrate thickness is between $t_c$ and $2t_c$, misfit dislocations will be developed above the effective critical thickness. However, threading dislocation free heteroepitaxy can still be achieved since the threading dislocations tend to be pushed into the thin substrate. In all conditions, the heteroepitaxy grown on thin substrates should be superior to those grown on regular substrates because of the larger effective critical thickness and the smaller dislocation image force.

Figure 4:
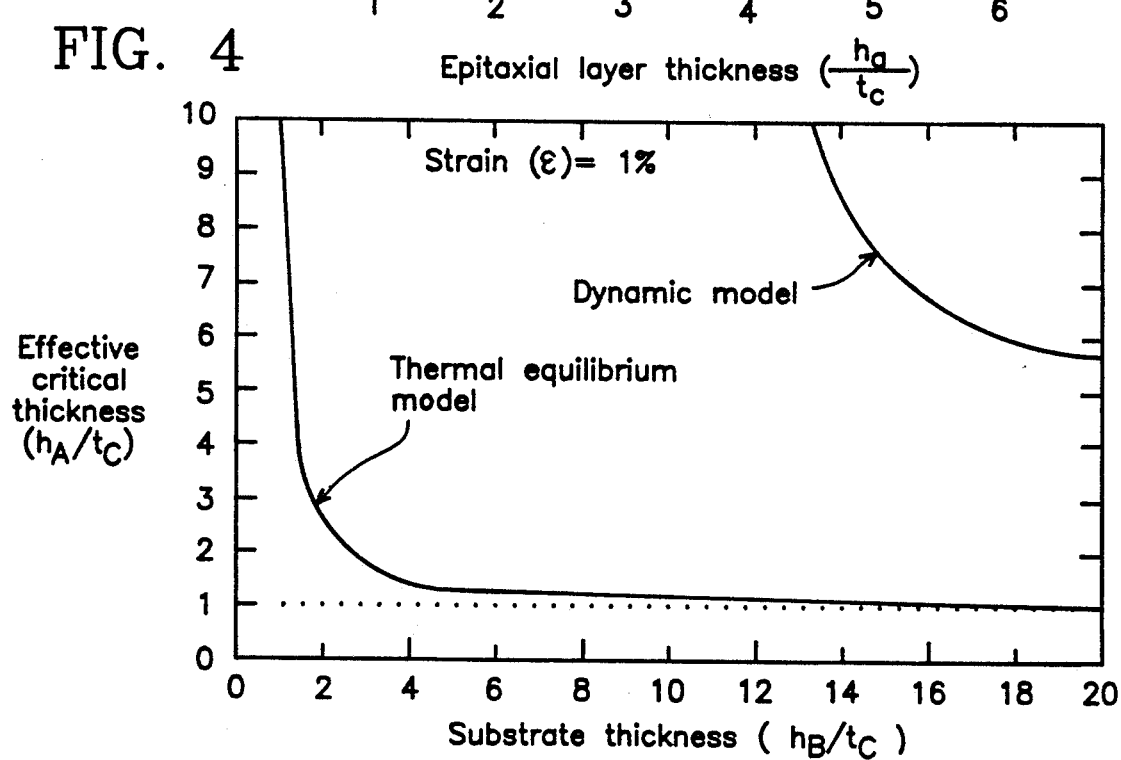
FIG. 4 graphically depicts the dependence of the maximum pseudomorphic thickness o the substrate thickness calculated from both a thermal equilibrium model and a dynamic model with all thicknesses being normalized to $t_c$.

The above thermal equilibrium analysis explains conceptually how the invention can result in dislocation free pseudomorphic and heteroepitaxial structures. In reality, materials seldom reach their thermal equilibrium state, and instead are often in a metastable state. From a dynamic model taking the dynamics of dislocation formation and strain relaxation into dynamic analysis, it is discovered that the requirement on the substrate thickness for pseudomorphic structures is greatly relaxed. FIG. 4 depicts the calculated maximum pseudomorphic thickness as a function of substrate thickness based on the previously described thermal equilibrium model and also on a dynamic model. Clearly, the thermal equilibrium model gives a conservative estimation, and it is revealed from the dynamic analysis that pseudomorphic and defect free heteroepitaxial structures can essentially be achieved using thicker substrates which are much easier to fabricate. For example, the dynamic analysis predicts that the substrate can be approximately 120 nm thick for 1% strain heteroepitaxy, and diaphragms of such thicknesses can be readily achieved for materials such as Si, GaAs, InP, etc.

Figure 5:
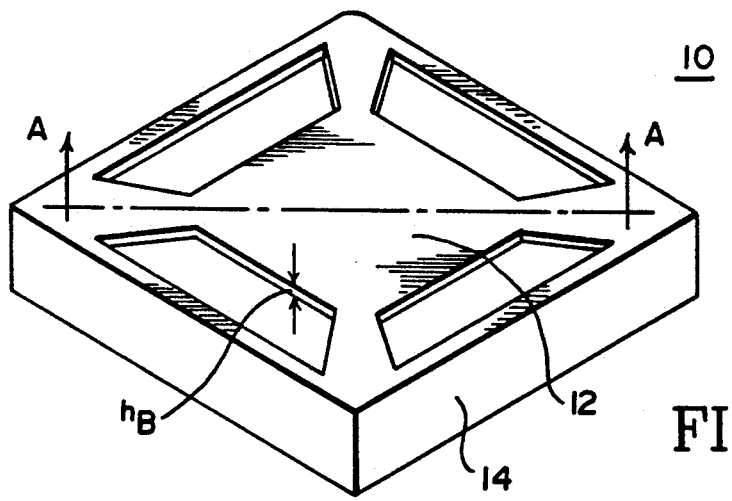
FIG. 5 is a diagrammatic perspective view of one possible configuration of a heteroepitaxial structure constructed in accordance with the present invention.

There are several ways to make nearly free standing, thin diaphragms from a thick substrate. FIG. 5 illustrates a pseudomorphic structure 10 which can be used as an example to manifest the general concept of the present invention. The structure 10 includes a corner supported diaphragm membrane 12 having an effective substrate thickness $h_B$ and formed in a thick substrate 14 by etching either from the back side of the substrate 14, or by side wall undercut etch. Both of these etching methods utilize the high etching selectivity between the material forming the thick substrate 14, and the material forming the diaphragm membrane 12. The required etching selectivity can be achieved from materials such as AlGaAs/GaAs, InGaAsP/InP, boron doped Si/undoped Si, etc.

Figure 6:
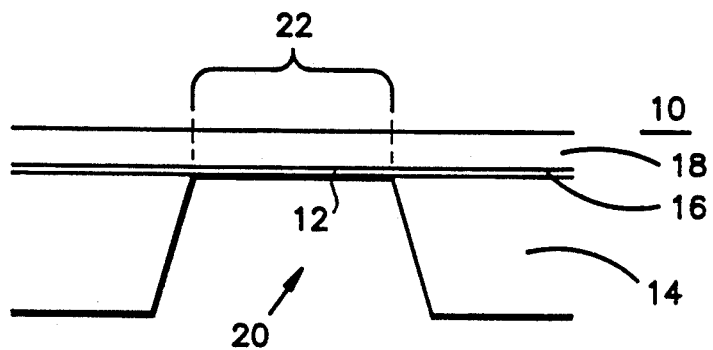
FIG. 6 is a diagrammatic cross sectional side view of the structure of FIG. 5 taken along the line A—A.

A cross sectional illustration of the pseudomorphic structure 10 is illustrated in FIG. 6. As shown, the structure 10 includes the conventional semiconductor substrate 14 having a very thin layer of material 16 formed thereon. The thin layer 16 is preferably chosen to have a thickness less than the critical thickness above which dislocations will form when a lattice mismatched epitaxial layer 18 is disposed thereon. Although the critical thickness differs depending on the material compositions of the layers 16 and 18, a typical thickness of the thin layer 16 would be on the order of approximately 1,000 angstroms according to the dynamic analysis.

Before the epitaxial layer 18 is formed by using any suitable technique, such as epitaxial growth, an aperture 20 is etched through the substrate 14 to expose the thin layer 16, thereby forming the diaphragm membrane 12 in the thin layer 16. If necessary, the diaphragm membrane 12 can be further thinned by a repetitive oxidation/etching process. The epitaxial layer 18 is then grown on the thin layer 16, and a pseudomorphic region 22 is formed therein directly above the thin diaphragm membrane 12. Since the thickness of the diaphragm membrane 12 is chosen to be less than the critical thickness, no misfit dislocations can form in the interface between the diaphragm membrane 12 and the pseudomorphic region 22 regardless of the thickness of the region 22. Thus, the structure of FIGS. 5 and 6 enables pseudomorphic devices to be formed which could not be previously formed without formation of misfit dislocations.

Figure 7:
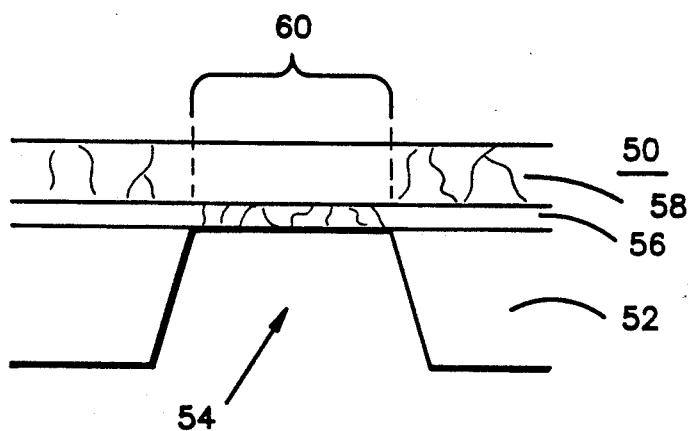
FIGS. 7 and 8 are diagrammatic cross sectional side views showing two steps of a process employing the concept of the present invention to form a layer of defect free heteroepitaxy.
Figure 8:
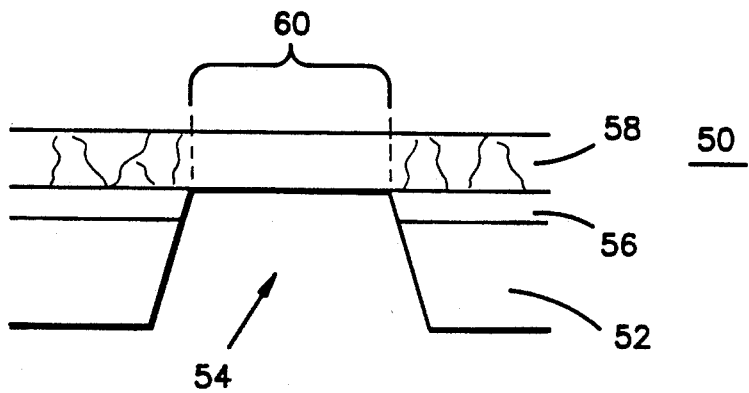

The fundamental concept which forms the basis for the present invention can also be employed to form defect free layers of heteroepitaxy as illustrated in FIGS. 7 and 8. In particular, FIG. 7 illustrates a heteroepitaxial structure 50 which has been formed much in the same manner as the structure 10 of FIGS. 5 and 6, and includes a semiconductor substrate 52 having an aperture 54 etched therein, a thin substrate 56 disposed on the substrate 52, and a heteroepitaxial layer 58 formed on the thin substrate 56. In accordance with the previously discussed theory, the thin substrate 56 is chosen to have a thickness less than approximately twice the critical thickness of the two materials in the layers 56 and 58 so that the resulting dislocation gettering effect will cause any dislocations to propagate into the thin substrate 56 above the aperture 54. Thus, a defect free heteroepitaxial region 60 of the layer 58 will be formed above the aperture 54. Then, as illustrated in FIG. 8, the exposed region of the thin substrate 56 in the aperture 54 can be removed using any suitable technique, thus leaving the defect free heteroepitaxial region 60 exposed on both top and bottom sides.

Figure 9:
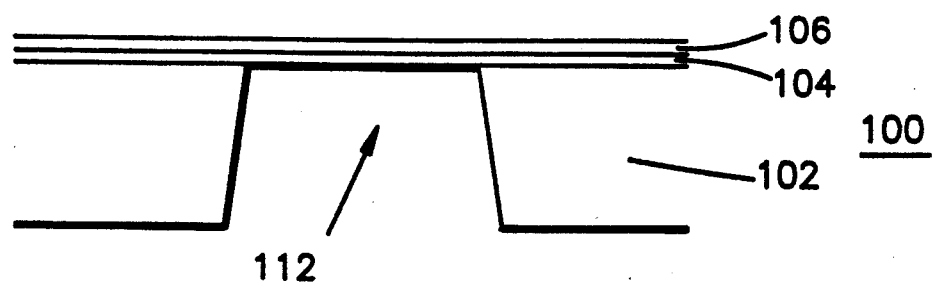
FIGS. 9-11 are diagrammatic cross sectional side views of the formation steps of a process employing the concept of the present invention to form a multiple layer superlattice heteroepitaxial structures.
Figure 10:
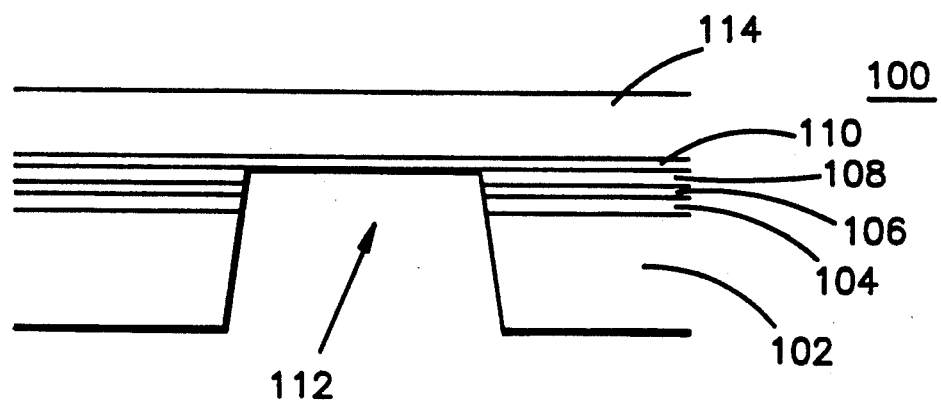

Turning now to FIGS. 9 and 10, the formation process of yet another structure employing the fundamental concept of the present invention is illustrated. In particular, a heteroepitaxial structure 100 is illustrated which, like the structure 10 of FIGS. 5 and 6, includes an apertured thick substrate 102 with a first thin layer 104 formed thereon. Unlike the structure 10, however, a plurality of additional thin layers 106, 108 and 110 are sequentially formed on top of the first thin layer 104 to form a multiple layer superlattice structure. As each successive thin layer is deposited on the previous thin layer, the portion of the previous thin layer exposed by an aperture 112 in the substrate 102 is removed. A final epitaxial layer 114 of any arbitrary thickness is then formed on the remaining thin layer 110, thus leaving the structure 100 appearing as in FIG. 10.

The structure 100 of FIGS. 9 and 10 can be utilized for the following purpose. If it is desired to employ a material for the epitaxial layer 114 that is highly mismatched (e.g. greater than 4%) with the material that forms the main substrate 102, the plurality of thin layers 104–110 can be employed to accommodate the mismatch. For example, the first thin layer 104 can be chosen to have a 1% strain relative to the substrate 102, while the next thin pseudomorphic layer 106 can be chosen to have a 2% strain to the substrate 102 and a corresponding 1% strain to the first pseudomorphic layer 104, etc. Removal of each previous thin layer after deposition of the next thin layer in aperture 112 insures that the strain will not be imparted through all of the thin layers 104–110 to the epitaxial layer 114 in the pseudomorphic region 120.

Figure 11:
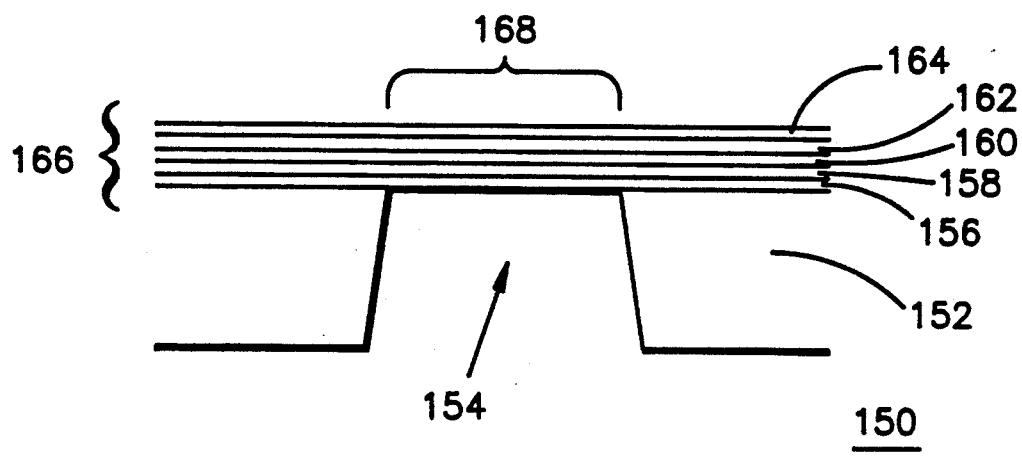

Another multiple layer structure is illustrated in FIG. 11, and is useful for strain compensation. In particular, a heteroepitaxial structure 150 is illustrated which includes a thick substrate 152 having an aperture 154 formed therein and a plurality of thin heteroepitaxial layers 156, 158, 160, 162 and 164 disposed thereon. The four topmost layers 158, 160, 162 and 164 form a conventional superlattice structure 166, while the bottommost layer 156 serves a strain compensation purpose as described below. A strain compensated region 168 is therefore formed in the superlattice structure 166 above the aperture 154. With superlattice structures, it is often the case that the substrate on which they are formed is substantially lattice mismatched with the layers of the superlattice such that a large strain is imparted by the substrate to the superlattice. With the structure 150 of FIG. 11, however, the strain compensation layer 156 is chosen to be formed from a material that will compensate for the lattice strains of the various layers of the superlattice 166. For example, if the layer 156 is formed from a material that is 2% lattice mismatched relative to the thick substrate 152, the layers 158 and 162 are formed from a material that is 1% lattice mismatched relative to the thick substrate 152, and the layers 160 and 164 are formed from a material that is 3% lattice mismatched with respect to the thick substrate 152, then a complete compensation of the lattice strain among the various layers will occur in the strain compensated region 168 above the aperture 154.

The concepts of the present invention can be employed with all types of materials, and by way of example, the thin layers or substrates can be formed from silicon, graphite, sapphire or compounds, such as GaAs, InP, etc. To prepare silicon substrates in accordance with FIGS. 5 and 6 for example, the established Si thin diaphragm technology originally developed for integrated sensors can be used. A very thin layer of boron doped Si can be formed by low energy ion implantation or Si epitaxial growth. Photochemical etching is then applied to remove the Si substrate from the backside wafer without attacking the boron doped thin layer. If necessary, the diaphragm can be further thinned by a repetitive oxidation/etching process. To prepare GaAs and InP samples, the high etching selectivity between the substrates and their ternary or quaternary compounds will be used. For example, the GaAs substrate etching is stopped by a AlGaAs layer, and the AlGaAs layer can be subsequently removed by buffered HF with only a thin layer of GaAs left. Similar techniques can also be applied to prepare InP samples.

In summary, two material structures, very thick pseudomorphic structures and threading dislocation free heteroepitaxy, considered impossible before, can now be achieved using the present invention. Consequently, a number of new semiconductor devices and circuits can be realized. For instance, GaAs optoelectronic devices such as lasers and detectors can be reliably integrated with Si integrated circuits. Lasers and photodetectors of long wavelengths (1.3 and 1.55 micrometers) can be integrated with GaAs optoelectronic devices. Visible lasers in the yellow/green regime can be made on GaAs substrates. The performance of SeGe/Si detectors and bipolar transistors will be substantially improved. Finally, high quality, novel materials such as SiC, diamond and high $T_c$ superconducting films, etc. can be more easily formed on the thin compliant substrates.

Although the present invention has been disclosed in terms of a number of preferred embodiments, it will be understood that numerous variations and modifications could be made thereto without departing from the scope of the invention as set forth in the following claims.

What is claimed is:

1. A semiconductor structure comprising:
   a) a semiconductor substrate layer having a thickness; and
   b) a heteroepitaxial layer disposed on said substrate layer formed from a material which is lattice mismatched with said substrate layer;
   wherein, said thickness of said substrate layer is chosen to be approximately less than or equal to a critical thickness above which dislocations will form between said substrate layer and said heteroepitaxial layer, whereby said heteroepitaxial layer can be formed having any arbitrary thickness without formation of dislocations between said substrate layer and said heteroepitaxial layer, thereby resulting in a pseudomorphic structure.

2. A semiconductor structure comprising:

a) a first, thick semiconductor substrate;
b) a plurality of thin heteroepitaxial layers formed on said thick substrate layer, said plurality of thin layers including at least a bottom layer and a top layer; each said thin layer having a thickness less than approximately a critical thickness above which dislocations will form between adjacent layers;
c) an arbitrarily thick heteroepitaxial layer formed on said top thin layer;
d) an aperture extending from a bottom side of said substrate through said substrate and all of the thin layers in said plurality of thin layers with the exception of said top thin layer, said aperture exposing a bottom side of said top thin layer; and
e) a pseudomorphic region formed in said arbitrarily thick heteroepitaxial layer over a region of said top thin layer above said aperture.

3. The structure of claim 2 wherein said bottom thin layer is formed from a material that is lattice mismatched with said substrate, each adjacent pair of layers in said plurality of thin layers is formed from materials which are lattice mismatched with one another, and said arbitrarily thick heteroepitaxial layer is formed from a material that is mismatched with the material of said top thin layer;

whereby, said arbitrarily thick heteroepitaxial layer can be formed from a material that has a lattice mismatch with the material of said thick substrate that is substantially larger than the individual lattice mismatches between said bottom thin layer and said substrate, between each adjacent pair of layers in said plurality of thin layers and between said arbitrarily thick heteroepitaxial layer in said top thin layer.

4. A heteroepitaxial semiconductor structure comprising:

a) a semiconductor substrate having a thickness and an aperture extending through said thickness;
b) a first heteroepitaxial layer disposed on said substrate; and,
c) a superlattice structure formed on said first heteroepitaxial layer, said superlattice structure comprising a plurality of additional heteroepitaxial layers;
wherein, said first heteroepitaxial layer is formed from a material having a lattice mismatch relative to said substrate which will compensate for lattice strains of said superlattice structure, thereby preventing lattice strains from being imparted by said substrate to said superlattice structure;
whereby a strain compensated region is formed in said superlattice structure above said aperture of said substrate.

5. A semiconductor structure comprising:
a) a semiconductor substrate having a thickness and an aperture extending through said thickness;
b) a semiconductor layer disposed on said semiconductor substrate, said semiconductor layer having a thickness and having a bottom side of a region thereof exposed by said aperture; and,
c) a heteroepitaxial layer disposed on said semiconductor layer formed from a material which is lattice mismatched with said semiconductor layer;
wherein, said thickness of said semiconductor layer is chosen to be approximately less than or equal to a critical thickness above which dislocations will form between said semiconductor layer and said heteroepitaxial layer, and a pseudomorphic region is formed in said heteroepitaxial layer above said exposed region of said semiconductor layer, whereby said heteroepitaxial layer can be formed having an arbitrary thickness without formation of dislocations between the exposed region of said semiconductor layer over said aperture and said heteroepitaxial layer.

* * * * *